(12) United States Patent
Gronheid et al.

(10) Patent No.: US 10,824,078 B2
(45) Date of Patent: Nov. 3, 2020

(54) LITHOGRAPHIC MASK LAYER

(71) Applicants: IMEC VZW, Leuven (BE); Katholieke Universiteit Leuven, KU LEUVEN R&D, Leuven (BE)

(72) Inventors: Roel Gronheid, Huldenberg (BE); Arjun Singh, Leuven (BE); Werner Knaepen, Holsbeek (BE)

(73) Assignees: Imec vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 15/813,913

(22) Filed: Nov. 15, 2017

(65) Prior Publication Data

US 2018/0173109 A1 Jun. 21, 2018

(30) Foreign Application Priority Data

Dec. 15, 2016 (EP) .................................... 16204313

(51) Int. Cl.
| | | |
|---|---|---|
| *G03F 7/20* | (2006.01) | |
| *G03F 7/42* | (2006.01) | |
| *G03F 7/004* | (2006.01) | |
| *G03F 7/40* | (2006.01) | |
| *G03F 7/38* | (2006.01) | |

(Continued)

(52) U.S. Cl.
CPC ........ *G03F 7/70625* (2013.01); *G03F 7/0002* (2013.01); *G03F 7/0047* (2013.01); *G03F 7/38* (2013.01); *G03F 7/40* (2013.01); *G03F 7/423* (2013.01); *G03F 7/427* (2013.01); *G03F 7/094* (2013.01)

(58) Field of Classification Search
None
See application file for complete search history.

(56) References Cited

U.S. PATENT DOCUMENTS 5,478,785 A * 12/1995 Glass ...................... C04B 35/01
                                                                  264/666
8,641,914 B2 * 2/2014 Regner ................... B05D 1/34
                                                                  216/17

(Continued)

OTHER PUBLICATIONS https://www.ceramicindustry.com/ext/resources/pdfs/2013-CCD-Material-Charts.pdf [citing Lewis, R.J. Sr.; Hawley's Condensed Chemical Dictionary 15th Edition. John Wiley & Sons, Inc. New York, NY 2007., p. 49].*

(Continued)

*Primary Examiner* — Allan W. Olsen
(74) *Attorney, Agent, or Firm* — McDonnell Boehnen Hulbert & Berghoff LLP

(57) ABSTRACT

An example embodiment relates to a method for making a mask layer. The method may include providing a patterned layer on a substrate, the patterned layer including at least a first set of lines of an organic material of a first nature, the lines having a line height, a first line width roughness, and being separated either by voids or by a material of a second nature. The method may further include infiltrating at least a top portion of the first set of lines with a metal or ceramic material. The method may further include removing the organic material by oxidative plasma etching, thereby forming a second set of lines of metal or ceramic material on the substrate, the second set of lines having a second line width roughness, smaller than the first line width roughness.

15 Claims, 5 Drawing Sheets

(51) Int. Cl.
G03F 7/00 (2006.01)
G03F 7/09 (2006.01)

(56) References Cited

U.S. PATENT DOCUMENTS

| | | | | |
|---|---|---|---|---|
| 8,669,645 | B2* | 3/2014 | Millward | B82Y 10/00 257/638 |
| 8,900,963 | B2* | 12/2014 | Sills | H01L 45/1233 257/2 |
| 8,980,418 | B2* | 3/2015 | Darling | G03F 7/405 428/220 |
| 9,087,699 | B2* | 7/2015 | Millward | H01L 21/76816 |
| 9,177,795 | B2* | 11/2015 | Hendricks | H01L 21/0273 |
| 9,411,237 | B2* | 8/2016 | Xie | G03F 7/405 |
| 9,487,600 | B2* | 11/2016 | Darling | C08F 8/42 |
| 9,765,214 | B2* | 9/2017 | Hustad | C08L 53/00 |
| 9,899,220 | B2* | 2/2018 | Chan | H01L 21/0332 |
| 9,916,980 | B1* | 3/2018 | Knaepen | H01L 21/0337 |
| 10,079,145 | B2* | 9/2018 | Chan | H01L 21/02356 |
| 10,189,704 | B2* | 1/2019 | Checco | B81C 1/00111 |
| 10,204,782 | B2* | 2/2019 | Maes | G03F 7/0002 |
| 2012/0088369 | A1* | 4/2012 | Weidman | G03F 7/0752 438/703 |
| 2012/0241411 | A1 | 9/2012 | Darling et al. | |
| 2013/0256265 | A1* | 10/2013 | Darling | G03F 7/0002 216/49 |
| 2014/0346142 | A1* | 11/2014 | Chapuis | C08J 7/02 216/51 |
| 2015/0031207 | A1* | 1/2015 | Bencher | H01L 21/0337 438/696 |
| 2015/0041431 | A1* | 2/2015 | Zafiropoulo | H01L 21/0273 216/48 |
| 2015/0225850 | A1* | 8/2015 | Arora | C23C 16/45525 216/51 |
| 2016/0148869 | A1* | 5/2016 | Schenker | H01L 21/0332 257/774 |
| 2016/0244557 | A1* | 8/2016 | Vora | G03F 7/0002 |
| 2016/0300756 | A1* | 10/2016 | Somervell | H01L 21/76224 |
| 2016/0365280 | A1* | 12/2016 | Brink | H01L 21/76897 |
| 2017/0170007 | A1* | 6/2017 | Chan | H01L 21/02356 |
| 2017/0170017 | A1* | 6/2017 | Chan | H01L 21/0332 |
| 2017/0233532 | A1* | 8/2017 | Arellano | C08G 81/027 216/58 |
| 2017/0242335 | A1* | 8/2017 | Chan | H01L 21/0271 |
| 2017/0298503 | A1* | 10/2017 | Maes | C23C 16/04 |
| 2017/0301542 | A1* | 10/2017 | Maes | G03F 7/0002 |
| 2017/0330760 | A1* | 11/2017 | Singh | H01L 21/0271 |
| 2018/0010248 | A1* | 1/2018 | Darling | C23C 16/06 |
| 2018/0122648 | A1* | 5/2018 | Kim | H01L 21/3086 |
| 2018/0171475 | A1* | 6/2018 | Maes | C23C 16/042 |
| 2018/0173109 | A1* | 6/2018 | Gronheid | G03F 7/0002 |
| 2018/0174826 | A1* | 6/2018 | Raaijmakers | C23C 16/45527 |
| 2019/0017166 | A1* | 1/2019 | Shevchenko | C23C 16/40 |

OTHER PUBLICATIONS

Ruiz et al. in, "Image Quality and Pattern Transfer in Directed Self Assembly with Block-Selective Atomic Layer Deposition", Journal of Vacuum Science & Technology B: Microelectronics and Nanometer Structures, 2012, 30, (6).*

* cited by examiner

LITHOGRAPHIC MASK LAYER

CROSS-REFERENCE TO RELATED APPLICATIONS

The present application is a non-provisional patent application claiming priority to European Patent Application No. 16204313.7, filed Dec. 15, 2016, the contents of which are hereby incorporated by reference.

FIELD OF THE DISCLOSURE

The present disclosure relates to lithographic mask layers and in particular to methods for improving the line characteristics in such layers.

BACKGROUND

Line edge roughness (LER) and line width roughness (LWR) are important parameters when making lithographic mask layers; particularly when the width of the lines in such a mask layer is scaled to 20 nm and below. Line edge roughness and line width roughness, for example, have a high impact on the electrical properties of the devices made from such masks. As such, among the challenges impeding introduction of extreme ultraviolet lithography (EUVL) to fabrication processes at advanced technology nodes, high LER and, correspondingly, high LWR are the most important ones. Furthermore, these considerations not only apply to EUVL photoresists, but also to masks based on other photoresists or on block copolymers.

A number of approaches have been developed to address the line edge roughness problem. Many efforts were put into optimization of resist compositions and processing conditions during the lithography step. Other methods apply additional treatment after formation of the pattern. However, despite multiple efforts, there is still no technique that could provide sufficiently low LER and LWR values for sub-20 nm lines.

US20120241411 A1 discloses the use of sequential infiltration synthesis (SIS) to increase the etch resistance of a resist material while maintaining the LER. However, the methods disclosed in US20120241411 A1 do not improve LER and/or LWR.

Thus, there is a need in the art for methods for making mask layers with improved line characteristics.

SUMMARY

Some embodiments may provide methods for making etch mask layers by a lithographic process.

Some embodiments may improve the line edge roughness of lines in the etch mask layer.

Some embodiments may also improve the line width roughness of lines in the etch mask layer.

Some embodiments may allow for control of the line width of lines in the etch mask layer.

Some embodiments may also improve the etch resistance of lines in the etch mask layer.

In a first aspect, the present disclosure relates to a method for making a mask layer. The method may include providing a patterned layer on a substrate, the patterned layer including at least a first set of lines of an organic material of a first nature, the lines having a line height, a first line width roughness, and being separated either by voids or by a material of a second nature. The method may further include infiltrating at least a top portion of the first set of lines with a metal or ceramic material, the metal or ceramic material having an actual density in the infiltrated lines of the first set and an intrinsic density.

The method may further include removing the organic material by oxidative plasma etching, thereby forming a second set of lines of metal or ceramic material on the substrate, the second set of lines having a second line width roughness, smaller than the first line width roughness. The metal or ceramic material actual density in the infiltrated lines of the first set may range from 15 to 85%, potentially from 25 to 65%, of the intrinsic density.

In a second aspect, the present disclosure relates to an assembly comprising a mask layer on a substrate, obtainable by the method according to any embodiment of the method of the first aspect.

In a third aspect, the present disclosure relates to a use of sequential infiltration synthesis, followed by the use of an oxidative plasma, for reducing a line edge roughness of an extreme ultraviolet lithography photoresist pattern.

Some aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics of the present disclosure will become apparent from the following detailed description, taken in conjunction with the accompanying drawings, which illustrate example embodiments. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
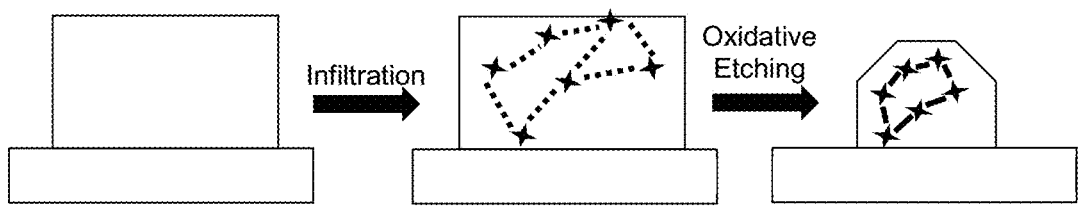
FIG. 1 is a schematic representation of a method according to an example embodiment.

In the different figures, the same reference signs may refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclousure is not limited by these descriptions, but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the example embodiments, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of some embodiments, various features are sometimes grouped together in a single embodiment, figure, or description thereof for the purpose of streamlining the disclosure and aiding in the understanding of one or more aspects of the disclosure. This method of disclosure, however, is not to be interpreted as reflecting an intention that the claims require more features than are expressly recited in each claim. Rather, as the following claims reflect, some aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the embodiment.

In the description provided herein, numerous specific details are set forth. However, it is understood that some embodiments may be practiced without these specific details. In other instances, well-known methods, structures and techniques have not been shown in detail in order not to obscure an understanding of this description.

The following terms are provided solely to aid in the understanding of the disclosure. As used herein, the line edge roughness (LER) of a line is a measure for the deviation of the line edge from a straight line, where the line edge is typically the top edge of a sidewall which stands perpendicular on the substrate. The line edge roughness may be quantified as 3 times the standard deviation from the straight line. The line edge roughness may for example be determined following the method steps of: (i) capturing images of known dimension with a critical dimension scanning electron microscope (CD-SEM), (ii) detecting the edges of the line features using image processing, (iii) determining the mean position of each edge, (iv) calculating the deviation of the detected edge from the mean position of the edge for a range of spatial wavelengths, and (v) determining the LER value as the root mean square value integrated over the spatial wavelength or frequency range.

As used herein, the line width roughness (LWR) of a line is a measure along the line length of the deviation of the line width from the average width, where the line width is typically taken as the distance between two longest line edges of the line top surface. The line width roughness may be quantified as 3 times the standard deviation of the line width. The line edge roughness may for example be determined following the method steps of (i) determining the LER of both opposing edges of a line, and (ii) determining the LWR by combining the LER of both opposing edges with a factor representing correlation of roughness between the two edges.

As used herein, line characteristics comprise at least line edge roughness and line width roughness. When it is said that the line characteristics are improved, it is meant that at least one of these characteristics is improved. In some embodiments, the line width itself, which may also be referred to as the critical dimension (CD), and the etch resistance of a line may also be characteristics that are sought to be improved.

As used herein, and unless provided otherwise, the term "exposed photoresist" relates to a photoresist material which has been exposed to a light or to an electron beam, such that the photoresist either loses its resistance or its susceptibility to attack by a particular etchant or solvent (called photoresist developer). The term "unexposed photoresist" relates to a photoresist material which solubility (e.g. resistance or susceptibility to attack) has not been modified by exposure to a light or electron beam.

In a first aspect, the present disclosure relates to a method for making a mask layer, including providing a patterned layer on a substrate. The patterned layer may include at least a first set of lines of an organic material of a first nature, the lines having a line height, a first line width roughness, and being separated either by voids or by a material of a second nature. The method may further include infiltrating at least a top portion of the first set of lines with a metal or ceramic material, the metal or ceramic material having an actual density in the infiltrated lines of the first set and an intrinsic density.

The method may further include removing the organic material by oxidative plasma etching, thereby forming a second set of lines of metal or ceramic material on the substrate, the second set of lines having a second line width roughness, smaller than the first line width roughness. The metal or ceramic material actual density in the infiltrated lines of the first set is from 15 to 85%, possibly from 25 to 65%, of the intrinsic density.

The infiltrating metal or ceramic material density can typically primarily be altered by changing the number of exposure cycles to the metal or ceramic material (or their precursors) and secondarily by changing the exposure conditions, such as temperature, duration and partial pressure of the metal or ceramic material (or their precursors).

The infiltrating metal or ceramic material density is defined as the total mass of the infiltrating metal or ceramic material divided by the total volume of infiltration. The total volume of infiltration is the volume of the portion of the first set of lines which is infiltrated. For each line, this is defined by the length of the line times the width of the line times the infiltration depth measured from the top surface, i.e. the depth at which the concentration of the metal or ceramic material is at least equal to 50% of the maximum metal or ceramic material concentration measured at the top surface of the line. This could be the whole volume of the lines if the concentration in metal or ceramic material does not drop below 50% of its surface value at any depth or it could be the volume of a top portion of the lines if the concentration in metal or ceramic material drops below 50% of its surface value in a lower portion of the lines. The total mass of infiltrating metal or ceramic material can be determined by measuring the mass of the substrate before and after the infiltration step and calculating the difference therebetween. The total volume of infiltration can be determined from cross-sectional transmission electron microscopy (X-TEM) with electron energy loss spectroscopy (EELS) elemental mapping or high-angle annular dark field (HAADF) elemental mapping.

It was found that only partially infiltrating an organic material, i.e. remaining below the maximum infiltration density, and subsequently oxidatively removing the organic material, forms a mask layer with improved line characteristics. Without being bound by theory, it is believed that the partial infiltration results in a loose framework of metal or ceramic material being formed, which subsequently reorganizes into a denser framework upon oxidative removal of the organic material (see FIG. 1). This reorganisation leads to a reduction in LER and LWR, compared to the original pattern. Furthermore, the infiltration metal or ceramic material typically may have an improved etch resistance compared to the organic material of the lines, facilitating transfer of the pattern into the substrate.

In embodiments, the first set of lines may have a first line edge roughness and the second set of lines may have a second line edge roughness, the second line edge roughness being at least 10%, possibly at least 20%, such as at least 30% or at least 40%, smaller than the first line edge roughness. In embodiments, the first set of lines may have a first line width roughness and the second set of lines may have a second line width roughness, the second line width roughness being at least 5%, possibly at least 10%, such as at least 20%, 30%, or 40% smaller than the first line width roughness. Lower LER and LWR may result in lower LER and LWR of the lines formed upon transferring the mask pattern into the substrate. This in turn may result in improved device characteristics, such as more uniformity across lines and better electrical properties. In some embodiments, such as when the patterned layer provided is a self-assembled block copolymer layer and the set of lines are made of one phase-separated domain of the block copolymer, the domain being made of one of the block types of the block copolymer, the first set of lines may already have an acceptable LWR due to the nature of the patterned layer. In these cases, the LWR improvement by the present method may be small (or absent) compared to the LER improvement.

In some embodiments, the first set of lines may have a first line width and the second set of lines may have a second line width, the second line width being at least 5%, such as least 10%, smaller than the first line width. The second line width may further be at least 20%, such as 40 to 60%, smaller than the first line width. A decrease in line width can, in some embodiments, be used to further scale down the line, e.g. beyond what is possible to achieve with the selected layer of organic material (e.g. block co-polymer of photoresist) or exposure (e.g. light exposure) technique. For example, starting from a first set of 20 nm thick lines and having a line width reduction of 50%, a second set of 10 nm thick lines can be formed. In other embodiments, the second line width may be substantially the same as the first line width, such as differing by less than 2%, and possibly less than 1%. Some embodiments may reproduce a second set of lines as close as possible to the first set of lines to ensure reproducibility.

In some embodiments, infiltrating at least a top portion of the first set of lines with a metal or ceramic material may comprise infiltrating only a top portion of the first set of lines, the top portion having a height of from 20 to 95%, such as from 40 to 80%, of the line height. This is particularly relevant when the patterned layer comprises a material of a second nature at least partially filling a space present between lines of the first set of lines. In some embodiments, the patterned layer comprising at least the first set of lines may be a block copolymer or a photoresist layer and infiltrating at least a top portion of the first set of lines with a metal or ceramic material may comprise infiltrating only a top portion of the first set of lines, the top portion having a height of from 20 to 95%, such as from 40 to 80%, of the line height.

In the present disclosure, a depth along a line height is considered to be infiltrated by the metal or ceramic material if the concentration thereof at that depth is at least equal to 50% of the maximum metal or ceramic material concentration measured at the top surface of the lines. In other words, the height of top portion which is infiltrated is the height of the lines of the first set which has a concentration in the infiltrating metal or ceramic material comprised between its maximum concentration in the line (at the top surface of the line) and 50% of this maximum value. This can be measured by a compositional analysis technique such as SIMS or XPS. Infiltrating only a top portion of the first set of lines can typically primarily be achieved by a suitable selection of exposure conditions, such as temperature, exposure duration and partial pressure of the metal or ceramic material (or their precursors). For instance, a suitable partial pressure can be easily selected for particular fixed conditions of temperature or exposure duration such that the adequate infiltration depth is achieved. Similarly, since the system does not typically reach equilibrium yet under the chosen conditions, for a fixed number of exposure cycles and given temperature and pressure, the length of each cycle can be made longer to reach a deeper infiltration or made shorter to reach a shallower infiltration.

It was found that only infiltrating a top portion of the line can have a further positive effect on the line characteristics. Without being bound by theory, it is known that the first set of lines may be affected by distortions near the line/substrate interface, as such this further positive effect is attributed to only infiltrating a top portion unaffected by these distortions. Examples of such distortions are for example domain shape distortions in the case of block copolymers, particularly when these are formed through directed self-assembly, as well as distortions due to the presence of residues after stripping (scumming) and contrast loss in the case of photoresists. This contrast loss may be due to a lower effect photon dose near the bottom of the photoresist due to absorption by the upper part of the layer, as well as reflections from the stack affecting contrast near the bottom of the photoresist. In some embodiments, infiltrating only a top portion of the first set of lines may be facilitated when the space (voids) present between the lines is at least partially (or completely) filled by the organic material of a second nature.

In embodiments, the patterned layer comprising at least the first set of lines may be a block copolymer layer or a photoresist layer, which may include an extreme ultraviolet lithography (EUVL) photoresist layer. A first set of lines may be defined in these types of layers and they may include organic materials which may be infiltrated with a metal or ceramic material. In some embodiments, the block copolymer layer is formed through directed self-assembly. In embodiments, the organic material may comprise only a low concentration of binding sites for the precursor, particularly irreversible binding sites. Trimethylaluminum is for example known to bind reversibly to carbonyl functional groups and irreversibly to hydroxyl functional groups. When the concentration of binding sites is too high, particularly when the binding is irreversible, the infiltration of the precursor past an initial depth may be excessively hampered.

In embodiments, the patterned layer comprising at least the first set of lines of an organic material of a first nature may further comprise a material of a second nature, different from the organic material of a first nature, at least partially filling a space present between lines of the first set of lines. The material of a second nature may be an organic material of a second nature. In the case of a block copolymer material, the first set of lines may for example comprise a first block of the block copolymer and the organic material of a second nature may comprise a second block of the block copolymer. In the case of a photoresist (e.g. an EUVL), infiltrating at least a top portion of the first set of lines with a metal or ceramic material may be performed before development of the exposed line pattern. For instance, the first set of lines may be made of exposed photoresist and the organic material of a second nature may be the unexposed photoresist present between the lines. Alternatively, the first set of lines may be made of unexposed photoresist and the organic material of a second nature may be the exposed photoresist present between the lines. In other embodiments, infiltrating at least a top portion of the first set of lines with a metal or ceramic material may be performed after development of the photoresist. For instance, the material of a second nature may be used to fill the voids left between the lines after development. In some embodiments, infiltrating at least a top portion of the first set of lines with a metal or ceramic material may be performed selectively with respect to the material of a second nature.

In alternative embodiments, lines of the first set of lines may be separated by voids; i.e. no material of a second nature may be present in a space between lines of the first set of lines. This is for example the case when lines are defined in an (EUVL) photoresist and either of a material exposed or unexposed to light is removed prior to infiltrating at least a top portion of the first set of lines with a metal or ceramic material. In embodiments, the void may expose a top portion of the substrate and the top portion of the substrate may be substantially free of infiltration by the metal or ceramic material. By substantially free, it is meant that the concentration of metal or ceramic material is lower than 10% of the maximum concentration measured at the top surface of the lines. It was found that a spin-on-glass (SOG) hardmask and/or a spin-on-carbon (SOC) mask as uppermost layers in a substrate can be infiltrated by the metal or ceramic material during the infiltration of at least a top portion of the first set of lines with a metal or ceramic material, particularly when there is no material of a second nature filling the space present between lines of the first set of lines. This infiltration in turn interferes with pattern transfer of the second set of lines into the substrate. As such, the uppermost layer composing the substrate might not be infiltrated by the metal or ceramic material. In some embodiments, at least a top layer of the substrate is provided by chemical vapour deposition (CVD) (e.g. plasma enhanced CVD, i.e. PECVD), atomic layer deposition (ALD), physical vapour deposition (PVD) or epitaxy (such as molecular beam epitaxy). In some embodiments, the substrate may comprise a hardmask layer of SiOC, $SiO_2$, SiON, SiN, TiN or AlN as the top layer. This layer may be deposited by CVD (e.g. PECVD), ALD, PVD or epitaxy. In some embodiments, the substrate may comprise a layer of amorphous material such as amorphous carbon (e.g. an Advanced Patterning Film (APF) layer, which may also be referred to as an Organic Patterning Layer (OPL)), or amorphous silicon as a layer underlying the top layer. In embodiments, the substrate may comprise a top layer (e.g., a hard mask top layer as exemplified above) deposited by CVD (e.g. PECVD), ALD, PVD or epitaxy and an amorphous layer underlying the top layer. In some embodiments, the substrate may comprise a top layer of a SiOC hardmask layer on top of the APF amorphous layer, both provided by PECVD. While the hard mask top layer (e.g. SiOC) prevents infiltration of the substrate by the metal or ceramic material and assures a high etch selectivity with respect to the photoresist and the amorphous layer, the amorphous layer (e.g. amorphous carbon) present under the hard mask layer enables the hard mask layer to be easier to etch and can more easily be provided as a thicker layer, therefore allowing the formation of a transferred pattern with higher features. In absence of the amorphous layer, the height of the features that could be formed in the hard mask would be more limited since the difference in etching speed between the EUVL mask and the hard mask is smaller than the difference in etching speed between the EUVL mask and the amorphous layer. The use of an amorphous layer below the hard mask may be beneficial as the hard mask typically has high etch selectivity towards amorphous materials like APF/OPL and photoresists. Thus, if a layer of amorphous material is used below the hardmask, the layer being thicker than the photoresist layer, we enable taller or higher aspect ratio mask features. It would be difficult to pattern a thick amorphous layer directly with the photoresist due to limited etch selectivity and the use very thick photoresists is disadvantageous as that may increase the photon dose used to print the pattern and also taller photoresist features are susceptible to collapse during development.

In embodiments, to promote the adhesion between the hard mask layer and the amorphous layer, an adhesion layer may be present between these two layers. A SiO2 layer may for instance fulfil this purpose. A possible layer stack forming a top portion of the substrate may therefore be composed of an AlN top layer, a $SiO_2$ interlayer, and an amorphous carbon bottom layer.

In embodiments, infiltrating at least a top portion of the first set of lines with a metal or ceramic material may comprise a sequential infiltration synthesis (SIS). In embodiments, the sequential infiltration synthesis may comprise:
  exposing the first set of lines to a first precursor, and
  exposing the first set of lines to a second precursor.

The SIS is typically performed in a reaction chamber. Typically, directly after exposing the first set of lines to a first precursor, a step of purging the reaction chamber with an inert gas (e.g. N2) is performed. Typically, directly after exposing the first set of lines to a second precursor, a step of purging the reaction chamber with an inert gas (e.g. N2) is performed.

In some embodiments, a sequence comprising exposing the first set of lines to a first precursor and exposing the first set of lines to a second precursor may be performed from 1 to 10, possibly from 3 to 6, or 4 or less, times. The number of cycles can of course be increased beyond 10 by reducing the duration of each exposure step. Similarly, a sufficient infiltration after few cycles can be obtained by using a higher partial pressure and longer exposure times of the precursor. The important criteria being that, for a given set of exposure conditions, the cycle should be repeated until the actual density of the metal or ceramic material infiltrated in the first set of lines reach 15 to 85%.

The first precursor is typically a first precursor of the metal or ceramic material. The second precursor is typically an oxidant.

In embodiments, the first precursor may be trimethylaluminum and the second precursor may be an oxidant, such as water. In embodiments, the ceramic material may be alumina. A SIS process is a suitable way for infiltrating at least the top portion of the first set of lines with the metal or ceramic material in a controlled fashion; through a (repeatable) sequence of exposure to two (or more) metal or ceramic material precursors. Multiple parameters can be fine-tuned within this process to achieve the desired infiltration. Trimethylaluminum may be used within this process as a ceramic material precursor and subsequent oxidation by exposure to water, which may form an infiltrated alumina.

Further, oxidatively removing the organic material may lead to an improvement of the line characteristics. In this context, the material stiffness of the second set of lines correlates with the roughness smoothening, i.e. LER and LWR reduction; where oxidizing etch chemistries may lead to an increase of the stiffness and no such effect could be observed when using more inert etch chemistries. In some embodiments, the oxidative plasma etching may comprise exposure to a plasma of O2 and an inert carrier gas, such as one of Ar, $N_2$ or He.

In a second aspect, the present disclosure relates to an assembly comprising a mask layer on a substrate, obtainable by the method according to the first aspect and any of its embodiments. In this second aspect, the mask layer and the substrate may be according to any embodiment of the first aspect.

This assembly may comprise a patterned layer on a substrate, the patterned layer comprising at least a first set of lines of organic material. In this second aspect, the patterned layer and the substrate may be according to any embodiment of the first aspect.

For instance, in an embodiment of the second aspect, the present disclosure relates to an assembly comprising a patterned extreme ultraviolet lithography photoresist layer on a substrate, the patterned extreme ultraviolet lithography photoresist layer comprising at least a first set of lines of organic material, wherein the top surface of the substrate is comprised in a hardmask layer of a material selected from SiOC, $SiO_2$, SiON, SiN, TiN and AlN.

In a third aspect, the present disclosure relates to a use of sequential infiltration synthesis, followed by the use of an oxidative plasma, for reducing a line edge roughness of an extreme ultraviolet lithography photoresist pattern.

In some embodiments, the different features of the third aspect may be as previously described for the first aspect and its embodiments.

The disclosure will now be described by a detailed description including several embodiments. It is clear that other embodiments can be configured without departing from the true technical teaching of this disclosure.

Example 1

Improvement of Line Characteristics of a Block Copolymer Pattern

Figure 2:
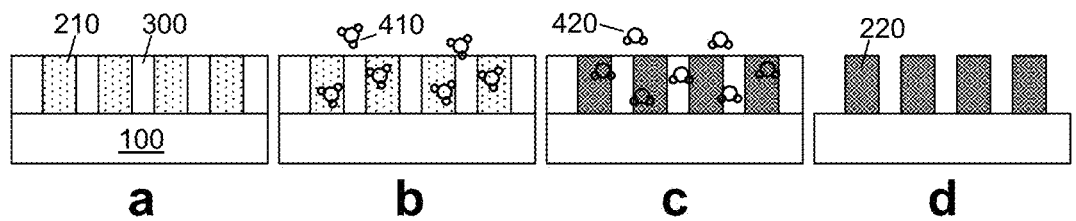
FIG. 2 is a schematic representation of a method according to an example embodiment.

We now refer to FIG. 2. In a reactor chamber, a 35 nm thick layer of a self-assembled 28 nm pitched poly(styrene-block-methyl methacrylate) (PS-b-PMMA) block copolymer comprising a first block (PMMA) making up a first set of lines (210) and a second block (PS) (300) filling spaces therebetween was provided on a substrate (100) comprising a chemical pattern (FIG. 2a); directed self-assembly of the block copolymer on the chemical pattern in achieved by annealing at 250° C. for 5 hours in a $N_2$ atmosphere. An $Al_2O_3$ ceramic material was infiltrated in the first block by a SIS process at 90° C., comprising exposing the first set of lines (210) to a trimethylaluminum first precursor (410; FIG. 2b) at a partial pressure of 0.1 Torr for 400 s/cycle, purging the reactor chamber with $N_2$ for 20 s, and subsequently exposing it to water as a second precursor (420; FIG. 2c) for 20 s, followed once again by purging the reactor chamber with $N_2$ for 2 min; this sequence was performed from 1 to 9 times. The first and second block were such that the infiltration operated selectively in the first block. Finally, the first and second blocks were removed (FIG. 2d) using an $O_2$/Ar etching, leaving a second set of lines (220) of the $Al_2O_3$ ceramic material. Table 1 below summarizes the changes in roughness in function of the alumina density.

TABLE 1

| Film thickness (nm) | 35 | 35 | 35 | 35 |
|---|---|---|---|---|
| Number of cycles | 1 | 3 | 6 | 9 |
| Mass gain (mg) | 0.3 | 0.9 | 1.4 | 2 |
| $Al_2O_3$ density (g/cm³) | 0.3 | 1.0 | 1.6 | 2.2 |
| $Al_2O_3$ density (%) | 7.5 | 25 | 40 | 55 |
| LER | — | 2.5 | 2.2 | 2.6 |
| LWR | — | 2.4 | 2.5 | 2.7 |
| Diffusion depth (nm) | 25 | 25 | 25 | 25 |
| Diffusion depth (%) | 71% | 71% | 71% | 71% |

Mass gain was determined by wafer mass measurements before and after the SIS process. Measured on the Metrxy Mentor 300 at imec.

$Al_2O_3$ density was defined as mass gain divided by diffusion volume, where diffusion volume was determined from X-TEM.

LER and LWR were determined as previously described.

Diffusion depth was determined by X-TEM with elemental mapping of Al, O, Si and N by EELS or HAADF.

As can be observed in the table above, as the number of cycles increases, the density of $Al_2O_3$ in the first set of lines increases. An optimum density corresponding to a minimum in LER is measured for a $Al_2O_3$ density of 40%.

Also, the diffusion depth was not significantly affected by the number of cycles. Diffusion depth is more a function of the temperature, cycle length and precursor partial pressure.

Figure 3:
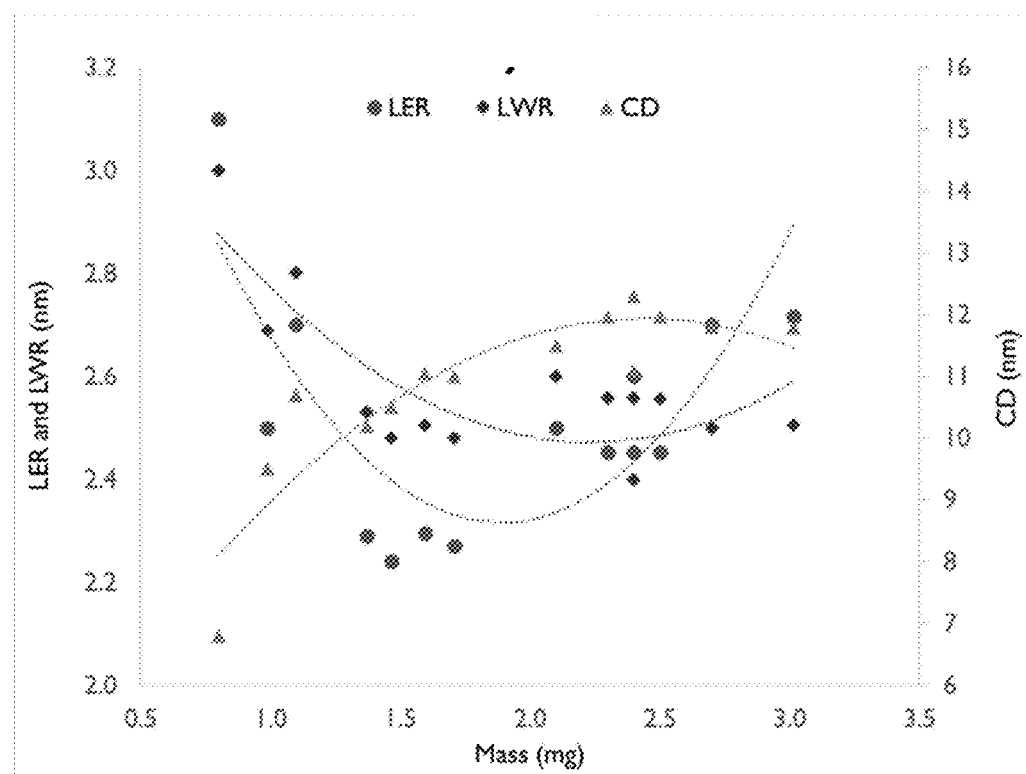
FIG. 3 is a plot of the LER, LWR and CD as a function of the mass of infiltrated metal or ceramic material of samples, according to an example embodiment.

We now refer to FIG. 3. FIG. 3 summarizes the experiments performed on 35 nm thick self-assembled block copolymer layers. The LER, LWR and CD (line width) of different samples were determined in function of the mass of infiltrated alumina for a fixed number of cycles equal to 6 and a diffusion depth in each case of about 70%. Increased mass gains were obtained by increasing the TMA half-cycle time, the temperature and/or the TMA partial pressure. As can be observed, mass gain and therefore $Al_2O_3$ density was the primary determinant when the diffusion depth was fixed. How that mass gain was obtained (increasing the TMA half-cycle time, the temperature and/or the TMA partial pressure) was largely irrelevant. Thus, it was observed that a partial infiltration of alumina leads to an improvement of the line characteristics; e.g. for a $Al_2O_3$ mass gain of from 1.4 to 1.7 mg, which corresponds to a density of from 1.6 to 1.9 g/cm³, which corresponds to a relative density (i.e. compared to an alumina actual density of 4 g/cm³) of from 40 to 48%, an improvement in the LER of about 12% was observed compared to the LER measured for a mass gain of 1.0 mg or 2.0 mg.

Example 2

Effect of Infiltration Depth on the Line Characteristics of a Block-Copolymer Pattern Table 2 below summarizes the changes in roughness in function of the relative diffusion depth. In this case, the diffusion depth was varied by changing the block copolymer film thickness.

TABLE 2

| Film thickness (nm) | 28 | 35 | 45 |
|---|---|---|---|
| Number of cycles | 6 | 6 | 6 |
| Mass gain (mg) | 2.2 | 2.3 | 2.3 |
| $Al_2O_3$ density (g/cm³) | 1.7 | 1.8 | 1.8 |
| $Al_2O_3$ density (%) | 42.5 | 45 | 45 |
| LER | 2.7 | 2.5 | 2.2 |
| LWR | 3.2 | 3.1 | 2.4 |
| Diffusion depth (nm) | 28 | 35 | 36 |
| Diffusion depth (%) | 100% | 100% | 80% |

As can be seen in Table 2, a diffusion depth of less than 100% is beneficial to both the LER and the LWR for an equivalent $Al_2O_3$ density.

Figure 7:
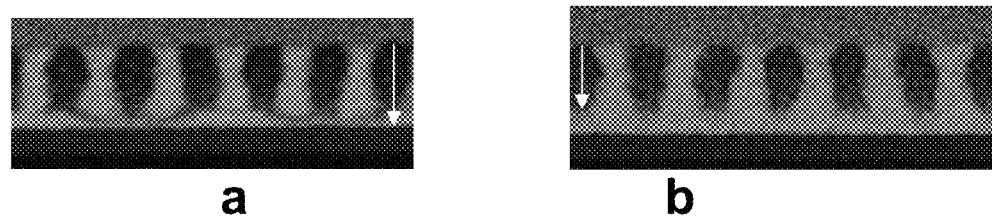
FIG. 7 shows X-TEM images with elemental mapping of masks obtained by a method according to an example embodiment.

We now refer to FIG. 7. Cross-sectional transmission electron microscopy (X-TEM) with elemental mapping images are shown of two samples characterized in Table 2 with a different thickness of the patterned film, i.e. 35 nm (FIG. 7a) vs 45 nm (FIG. 7b). The infiltration conditions in both samples were the same, such that infiltration (indicated by the white arrows) occurred over the entire depth in the first case, compared to a relative depth of only 80% in the second case. A LER of 2.5 nm and a LWR of 3.1 nm was observed in the first case, whereas in the second case a LER 2.2 nm and a LWR of 2.4 nm was seen. In other words, by limiting the relative infiltration depth to 80%, as opposed to 100%, an improvement of LER of 12% and in LWR of 23% was observed.

Table 3 below summarize the changes in roughness in function of the relative diffusion depth when the film thickness is the same for all samples but the diffusion depth is varied by changing the TMA half-cycle time, the temperature and/or the TMA partial pressure.

TABLE 3

| Film thickness (nm) | 35 | 35 | 35 | 35 |
|---|---|---|---|---|
| Number of cycles | 6 | 6 | 6 | 6 |
| Mass gain (mg) | 1.3 | 1.2 | 2.6 | 2.9 |
| $Al_2O_3$ density (g/cm³) | 1.9 | 1.7 | 1.7 | 2.0 |
| $Al_2O_3$ density (%) | 47.5 | 42.5 | 42.5 | 50 |
| LER | 2.6 | 2.3 | 2.4 | 2.7 |
| LWR | 2.8 | 2.7 | 3.2 | 2.6 |
| Diffusion depth (nm) | 20 | 20 | 33 | 35 |
| Diffusion depth (%) | 57% | 57% | 94% | 100% |

As can be seen in this table, the best LER were achieved for a diffusion depth lower than 100%.

Example 3

Relation Between Metal or Ceramic Material Stiffness and Line Characteristics and Effect of Etch Chemistries on the Line Characteristics Using the samples of Table 1 in example 1, the stiffness of the first block (pristine PMMA) and of the second set of lines (obtained after removing the block copolymer by oxidative plasma etching with a mixture Ar/$O_2$) was measured in function of the plasma exposure time using atomic force microscopy (AFM) in contact mode; the stiffness was quantified as a reduced modulus using the Derjaguin-Muller-Toporov (DMT) model. A higher reduced modulus was obtained for the sample displaying the lowest LER. The reduced modulus was seen to generally increase for longer plasma exposure when using oxidizing plasma etch chemistries such as Ar/$O_2$.

Conversely, such an increase in material stiffness for longer plasma exposure was not seen when using reductive plasma etch chemistries such as $N_2/H_2$ (not shown). Various etching chemistries were tried and the following LER were subsequently measured: $Ar/O_2$: 2.5 nm; $He/O_2$: 2.5 nm; $N_2/O_2$: 2.6 nm; $N_2/H_2$: 3.1 nm; $Ar/H_2$: 3.6 nm. The LER of the PS lines obtained when no infiltration is performed (reference) is 3.8 nm.

This indicates that the best improvement of the LER is observed when the etching is oxidative; an observation that was further supported by PSD plots (not shown) showing comparable line characteristics to the reference when a $N_2/H_2$ plasma etching was used.

Example 4

Improvement of Line Characteristics of an EUVL Pattern

Figure 4:
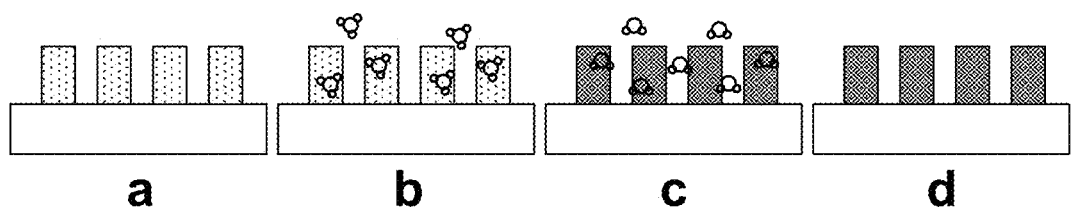
FIG. 4 is a schematic representation of a method, according to an example embodiment.

We now refer to FIG. 4. In a reactor chamber, a 40 nm patterned layer of an EUVL photoresist (either JSR EUV J1915 or J3030 resist) comprising an organic material making up a first set of lines (210) and voids therebetween was provided on a substrate (100) (FIG. 4a). An $Al_2O_3$ ceramic material was infiltrated in the photoresist by a SIS process, comprising a first cycle of exposing the first set of lines (210) to a trimethylaluminum first precursor (410; FIG. 4b) at a partial pressure of 0.5 Torr for 3000 s, purging the reactor chamber with $N_2$ for 20 s, exposing the first set of lines to water as a second precursor (420; FIG. 4c) for 20 s, followed once again by purging the reactor chamber with $N_2$ for 2 min; this sequence typically is repeated in a second cycle, with the difference that the exposure to the trimethylaluminum first precursor is reduced to 300 s. Finally, the EUVL photoresist was removed (FIG. 4d) using an $O_2/Ar$, leaving a second set of lines (220) of the ceramic material.

Figure 5:
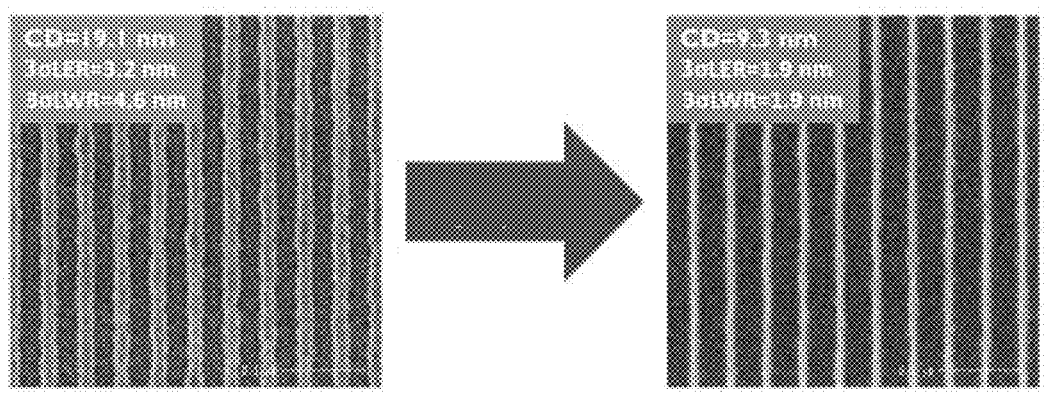
FIG. 5 is a top view CD-SEM image of a mask layer obtained by a method according to an example embodiment.

We now refer to FIG. 5. A top down critical dimension scanning electron microscope (CD-SEM) image shows the difference in lines before (FIG. 5a) and after (FIG. 5b) the method of the present disclosure. A reduction in LER of 41%, in LWR of 59% and in CD of 51% was observed.

Figure 6:
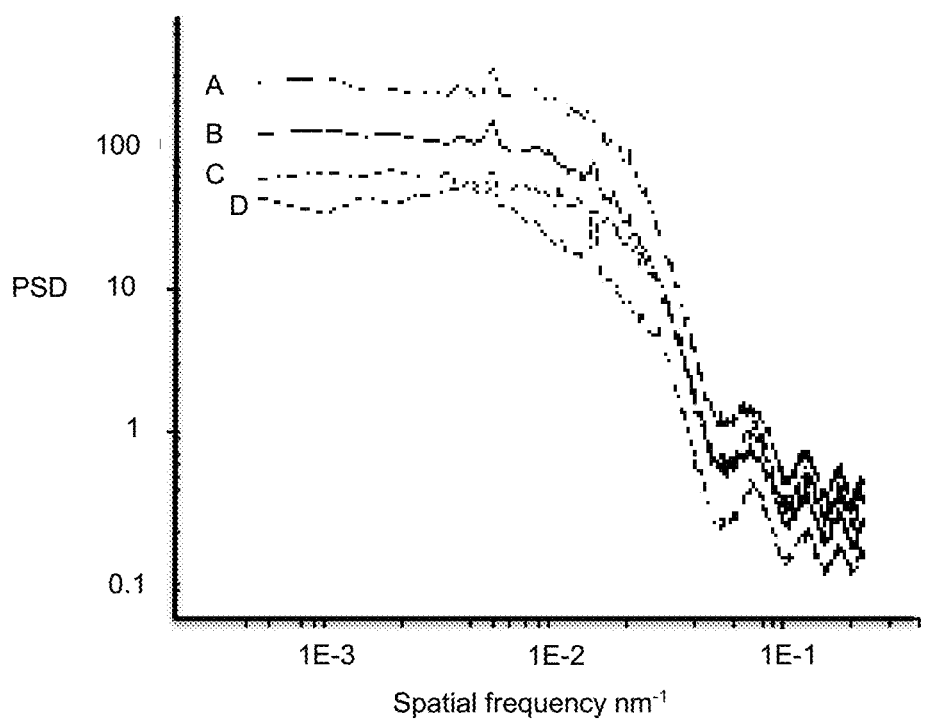
FIG. 6 shows PSD plots of the LER and LWR of mask layers obtained before and after performance of a method according to an example embodiment.

We now refer to FIG. 6. Power spectrum density (PSD) plots for the LER and LWR show roughness improvements across the high, medium and low frequency ranges. Curve A shows LWR of the first set of lines (before SIS). Curve B shows LER of the first set of line (before SIS). Curve C shows LER of the second set of lines (after SIS and plasma). Curve D shows LWR of the second set of lines (after SIS and plasma).

Example 5

Effect of Hydroxyl Groups in the Organic Material

Figure 8:
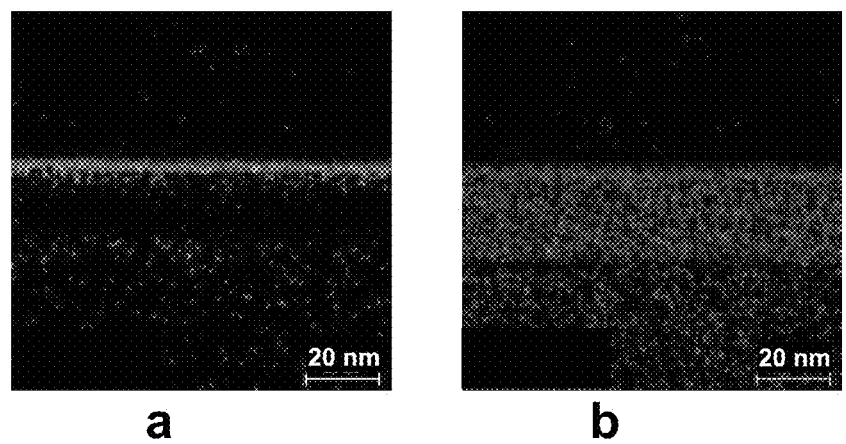
FIG. 8 shows X-TEM images with elemental mapping comparing EUVL photoresist samples having different hydroxyl group content when exposed to Al2O3 precursors.

We now refer to FIG. 8. Two samples based on EUVL photoresists were exposed to $Al_2O_3$ precursors as indicated in example 4. Prior to exposure, the first sample was treated by flood UV irradiation in order to deprotect the hydroxyl functional groups of the hydroxystyrene monomeric units present in the photoresist while the second sample was not treated by flood UV irradiation. After exposure, the samples where observed using X-TEM with elemental mapping. In the first sample (FIG. 8a) containing a high concentration of hydroxyl groups in the organic material, all the trimethylaluminum first precursor were already (reversibly) bound to the hydroxyl groups within the first few nm, so that the infiltration was limited to the surface. In a second sample (FIG. 8b) containing a low concentration of hydroxyl groups in the organic layer, the trimethylaluminum first precursor was able to diffuse deeply into the organic material and the infiltration was more uniform. A more uniform film infiltration is desirable in order to form the framework that shrinks after etch, resulting e.g. in line roughness improvement; as opposed to forming a shell around or within the first few nm of the lines.

Example 6

Effect of Substrate Uppermost Layers on Pattern Transfer

Figure 9:
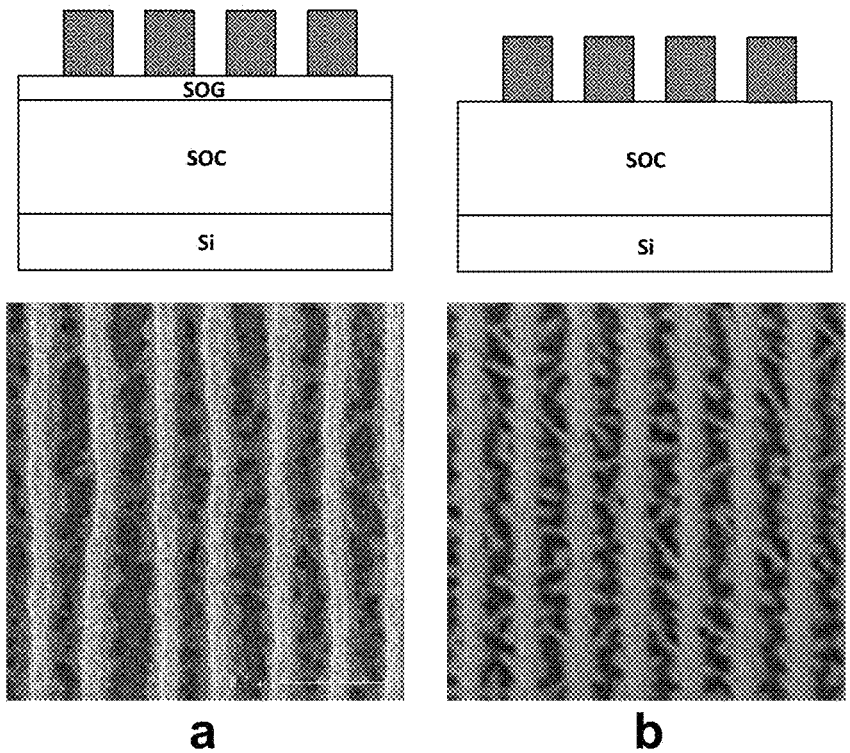
FIG. 9 shows schematic representations and CD-SEM images of masks obtained by a method according to an example embodiment.

We now refer to FIG. 9. Two schematic representations are shown corresponding to two samples based on EUVL photoresists that were prepared as described in example 4 (only the first cycle is performed in this case). The second set of lines was subsequently transferred into the substrate's top layer. A top view of the result is shown in the corresponding CD-SEM images. As can be seen, both when the top layer is a spin on glass (SOG) hardmask (FIG. 9a) or a spin on carbon (SOC) mask (FIG. 9b), the transferred pattern was faulty which was linked to the top layer of the substrate, in both cases, also being infiltrated with the ceramic material.

Figure 10:
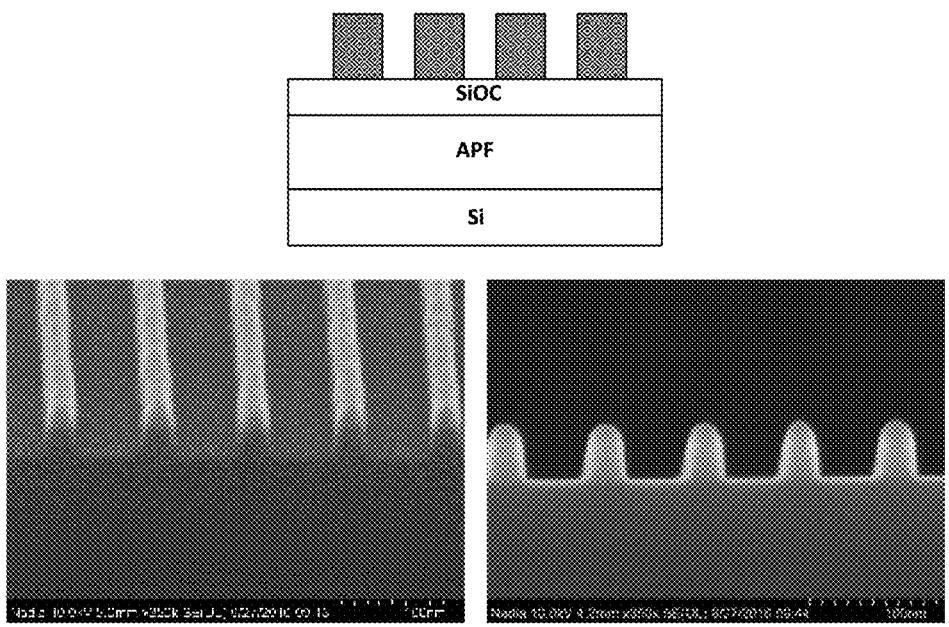
FIG. 10 shows schematic representations and X-SEM images of a sample according to an example embodiment.

We now refer to FIG. 10. Conversely, when using a SiOC layer on top of an APF layer as the substrate's top layer, both substrates being deposited by PECVD, no infiltration by the ceramic material of the SiOC top layer occurred and the second set of lines could be neatly transferred.

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method of making a mask layer, comprising:
providing a patterned layer on a substrate, the patterned layer comprising a first set of lines of an organic material of a first nature, wherein each line of the first set of lines has a line height, a first line width roughness, a first line edge roughness, and is separated by voids, the voids exposing a top surface of the substrate, the top surface of the substrate being such that no infiltrating by a metal or ceramic material can occur, wherein the top surface of the substrate is comprised of a layer formed by chemical vapor deposition, and wherein the top surface of the substrate comprises a first layer and wherein a second layer, underlying the first layer, comprises an amorphous material;

infiltrating at least a top portion of the first set of lines with the metal or ceramic material, the metal or ceramic material having an actual density in the infiltrated lines of the first set of lines; and removing the organic material by oxidative plasma etching, wherein removing the organic material forms a second set of lines, wherein the second set of lines is formed of the metal or ceramic material and has a second line width roughness and a second line edge roughness, wherein the second line width roughness is at least 40% smaller than the first line width roughness and the second line edge roughness is at least 40% smaller than the first line edge roughness.

2. The method according to claim 1, wherein the patterned layer is a block copolymer layer or a photoresist layer.

3. The method according to claim 2, wherein the photoresist layer is an extreme ultraviolet lithography photoresist layer.

4. The method according to claim 2, wherein the organic material of a first nature is made of one block of the block copolymer layer and wherein an organic material of a second nature is made of another block of the block copolymer layer.

5. The method according to claim 2, wherein the organic material of a first nature is made of exposed photoresist and an organic material of a second nature is made of unexposed photoresist or wherein the organic material of a first nature is made of unexposed photoresist and the organic material of a second nature is made of exposed photoresist.

6. The method according to claim 1, wherein the ceramic material is alumina.

7. The method according to claim 1, wherein infiltrating at least the top portion of the first set of lines comprises a sequential infiltration synthesis.

8. The method according to claim 7, wherein the sequential infiltration synthesis comprises:
exposing the first set of lines to a first precursor; and
exposing the first set of lines to a second precursor, wherein the sequential infiltration synthesis is repeated between 1 and 4 times.

9. The method according to claim 8, wherein the first precursor is trimethylaluminum and wherein the second precursor is an oxidant.

10. The method according to claim 1, wherein the oxidative plasma etching comprises exposure to a plasma of $O_2$ and one of Ar, $N_2$, or He.

11. The method according to claim 10, wherein each line of the first set of lines is separated by an organic material of a second nature and wherein infiltrating at least the top portion of the first set of lines is performed selectively on the first set of lines with respect to the organic material of a second nature.

12. The method according to claim 1, wherein the top surface of the substrate is comprised of a hardmask layer of a material selected from SiOC, $SiO_2$, SiON, SiN, TiN and AlN.

13. The method according to claim 1, wherein the first layer and the second layer are separated by an adhesion layer.

14. The method according to claim 13, wherein the amorphous material is amorphous carbon.

15. The method according to claim 1, wherein infiltrating the at least the top portion of the first set of lines is performed so as to reduce distortions near a line interface.

* * * * *